US008020486B2

(12) United States Patent
Yamamoto et al.

(10) Patent No.: US 8,020,486 B2
(45) Date of Patent: Sep. 20, 2011

(54) OPERATING DEVICE

(75) Inventors: Naoyuki Yamamoto, Kanagawa (JP); Ryouhei Yamamoto, Kanagawa (JP)

(73) Assignee: Fumoto Giken Co., Ltd., Miura-gun (JP)

( * ) Notice: Subject to any disclaimer, the term of this patent is extended or adjusted under 35 U.S.C. 154(b) by 658 days.

(21) Appl. No.: 12/154,457

(22) Filed: May 22, 2008

(65) Prior Publication Data

US 2009/0056326 A1 Mar. 5, 2009

(30) Foreign Application Priority Data

Sep. 4, 2007 (JP) ................................ 2007-228494

(51) Int. Cl.
*H05K 7/00* (2006.01)
*A61G 7/00* (2006.01)

(52) U.S. Cl. ................................ 91/515; 60/565; 5/614

(58) Field of Classification Search ........ 5/614; 60/484, 60/565; 91/508, 514, 515
See application file for complete search history.

(56) References Cited

U.S. PATENT DOCUMENTS

| | | | | |
|---|---|---|---|---|
| 2,460,774 | A * | 2/1949 | Trautman | 137/101 |
| 2,517,466 | A * | 8/1950 | Cox | 5/614 |
| 2,687,536 | A * | 8/1954 | Miller | 5/614 |
| 2,788,529 | A * | 4/1957 | Moritzacky et al. | 5/634 |
| 2,865,175 | A * | 12/1958 | Gondek | 60/426 |
| 4,751,755 | A * | 6/1988 | Carey et al. | 5/614 |
| 7,553,120 | B2 * | 6/2009 | Veneziani | 91/514 |

FOREIGN PATENT DOCUMENTS

JP H05-004570 A 1/1993

* cited by examiner

*Primary Examiner* — Thomas E Lazo
(74) *Attorney, Agent, or Firm* — Masuvalley & Partners

(57) ABSTRACT

The objective of the present invention is to provide a device that accurately communicates a subtle variation of an operation side to an action side. Specifically, in the present invention, an operating device is provided to perform a lock release operation of an extension device. The operating device feeds oil to a valve chamber by pressing a piston. When the flow rate of the fed oil is excessive, the valve is pressed to an opening resisting a biasing force of a compressed spring, thereby a rapid increase in the oil supplied to the action section is suppressed. Further, the supplied oil is suppressed to a very small amount by the throttle section, thereby an increase in the operation amount on the action section side is suppressed while maintaining the supply of the oil.

18 Claims, 15 Drawing Sheets

OPERATING DEVICE

TECHNICAL FIELD

The present invention relates to an operating device, more specifically, an operating device in which an operating pressure is communicated through a pressure communicating medium.

BACKGROUND OF THE INVENTION

Conventionally, a device, which communicates a pressure by a fluid, such as oil, to communicate an operating amount at an action side from an operating side, has been used. In such a device, it is common to have a configuration, for example, such that oil in a cylinder is pushed out by pressing a piston on the operating side, and move the piston on the action side through an oil conducting tube, thereby the operating amount is communicated to a predetermined device. Such device is disclosed, for example, in Japanese Unexamined Patent Application No. H5-4570.

However, when the conventional operating device is applied to communicating an operating amount of fluid by using a foot brake operated by a foot, there has been an issue of difficulty in accurately communicating a subtle move of an operating side to an action side. Further, in a case when communicating an operating amount of fluid from the operating side to a plurality of pistons on the action side, the amount of movement for each piston on the action side may result in difference movements, thus there has been a problem of further difficulty in accurately communicating a subtle move to the action side.

SUMMARY OF THE INVENTION

The present invention has been made considering the above facts, and the objective is to provide a device capable of accurately communicating a slight movement of an operating side to an action side. Further, the present invention provides a device capable of equally communicating an operating amount of fluid from the operating side to a plurality of action sides.

One aspect of the present invention is an operating device that includes a pressurizing operation unit for pressurizing a pressure communicating medium in a fluid form by the displacement of an operating member by an external operation, a plurality of action units for operating the pressure applied from the pressurizing operation unit by converting a switching operation of a position fixed state and a released state of a positioning unit, a conducting channel for leading out the pressure communicating medium from the pressurizing operation unit, a bifurcating section for distributing the pressure communicating medium to the plurality of the action units from the conducting channel, a branch channel for guiding the pressure communicating medium to each action unit from the bifurcating section, wherein each of the branch channels further includes a flow rate regulating unit for regulating the flow rate of the pressure communicating medium and each of the flow rate regulating units equalizes the flow rate of the pressure communicating medium circulating each of the branch channels.

The positioning unit is a positioning unit of an extension device provided with a cylinder and a piston inserted into the cylinder. And the positioning unit may further be provided with an on-off valve to open and shut the flow of a fluid flowing in the cylinder chambers formed on both sides of the piston.

The flow rate regulating unit has a valve chamber provided with an inlet and an outlet for the pressure communicating medium, and an inside of the valve chamber may be provided with a throttle section for regulating the amount of the pressure communicating medium outflowing from the outlet and a valve for operating the throttle section.

Each of the throttle sections and the valve has a channel capable of circulating the pressure communicating medium, and the traverse area of the channel of the throttle may be smaller than the traverse area of the channel of the valve.

A bias member may be provided at a position which contacts the valve. The bias member may be a compressed spring.

The flow rate regulating unit includes a bias member for operating the position of the valve, and a valve and a valve seat for adjusting the traverse area of the circulating channel. And the flow rate of the pressure communicating medium may be regulated by adjusting the space formed between the valve and the valve seat. The present invention may be a nursing care bed characterized by having the operating device.

Another aspect of the present invention is an operating device that includes a pressurizing operation unit for applying a pressure to the pressure communicating medium in a fluid form by a displacement of the operating member from an external operation, an action unit for operating the pressure applied from the pressurizing unit by converting the pressure to a switching operation of a fixed state and a released state of a positioning unit, a flow rate regulating unit for regulating the flow rate of the pressure communicating medium leading out from the pressurizing operation unit, and a conducting channel for leading out the pressure communicating medium from the pressurizing operation unit, wherein the flow rate regulating unit further includes a valve chamber having an inlet for inflowing the pressure communicating medium fed from the pressurizing operation unit and an outlet for outflowing the same, a valve that is pressed to the inlet by a bias member for closing the outlet in a case when the flow rate of the pressure communicating medium exceeds a predetermined amount, and a throttle for regulating the flow rate passing through the outlet when the valve closes the outlet.

The conducting channel is provided with a plurality of branch channels leading out of the pressure communicating medium, and the flow rate regulating unit may be provided to each of the bifurcating channels.

The flow rate of the pressure communicating medium leading out to the action unit from each bifurcating channel may be equal.

The throttle section and the valve each has a channel capable of outflowing the pressure communicating medium, and the traverse area of the channel of the throttle section may be smaller than the traverse area of the channel of the valve.

The bias member may be a compressed spring.

The flow rate regulating unit further includes a bias member for operating the position of the valve, and a valve and a valve seat for adjusting the traverse area of the circulating channel. And the flow rate of the pressure communicating medium may be regulated by adjusting the width of the space formed between the valve and the valve seat.

Another aspect of the present invention is an operating device that includes a pressurizing unit for pressurizing the pressure communicating medium, an action unit for feeding the pressure applied by the pressurizing unit to a plurality of positioning units, a plurality of branch channels for distributing the pressurized pressure communicating medium to the plurality of positioning units, a flow rate regulating unit provided to each of the plurality of branch channels for regulating the flow rate of the pressure communicating medium, wherein the flow rate regulating unit equalizes the flow rate of the pressure communicating medium circulating in each of the branch channels.

The flow rate regulating unit further includes a valve chamber having an inlet for inflowing the pressure communicating medium and an outlet for outflowing the same, and in the valve chamber, provided are a valve and valve seat for adjusting the flow rate of the pressure communicating medium, and a bias member for operating the position of the valve. And the flow rate of the pressure communicating medium may be regulated by adjusting the width of the space formed between a valve and the valve seat.

The bias member may be a compressed spring. The width of the space formed between the valve and the valve seat may be adjusted in a case when the outflow rate of the pressure communicating medium exceeds a predetermined amount. The conducting channel and the branch channel may be formed with a flexible material. And the flexible material may be a synthetic resin.

According to the present invention, because each of the branch channels is provided with the flow rate regulating unit, an equal operating amount can be communicated to the plurality of action units. According to the present invention, the operation of the positioning unit of the plurality of the extension devices can be simultaneously performed by one pressurizing operation unit on the operating side, and the timing of the operation of the positioning unit can be the same.

According to the present invention, because the valve closes the outlet and the throttle operates when the operating amount of the pressurizing operation unit by an operator exceeds a predetermined value, a rapid change in the operating amount communicated to the action unit can be regulated. For this reason, for example, trouble during positioning by an extension device equipped with an air spring, such as sudden expansion of the extension device due to the sudden opening of the valve of the positioning device may be suppressed. Further, the pressure communicating medium is supplied in a very small amount through the throttle, thus the communication of the operating amount is continued and an interruption of the operation does not occur.

DETAILED DESCRIPTION OF INVENTION

Figure 1:
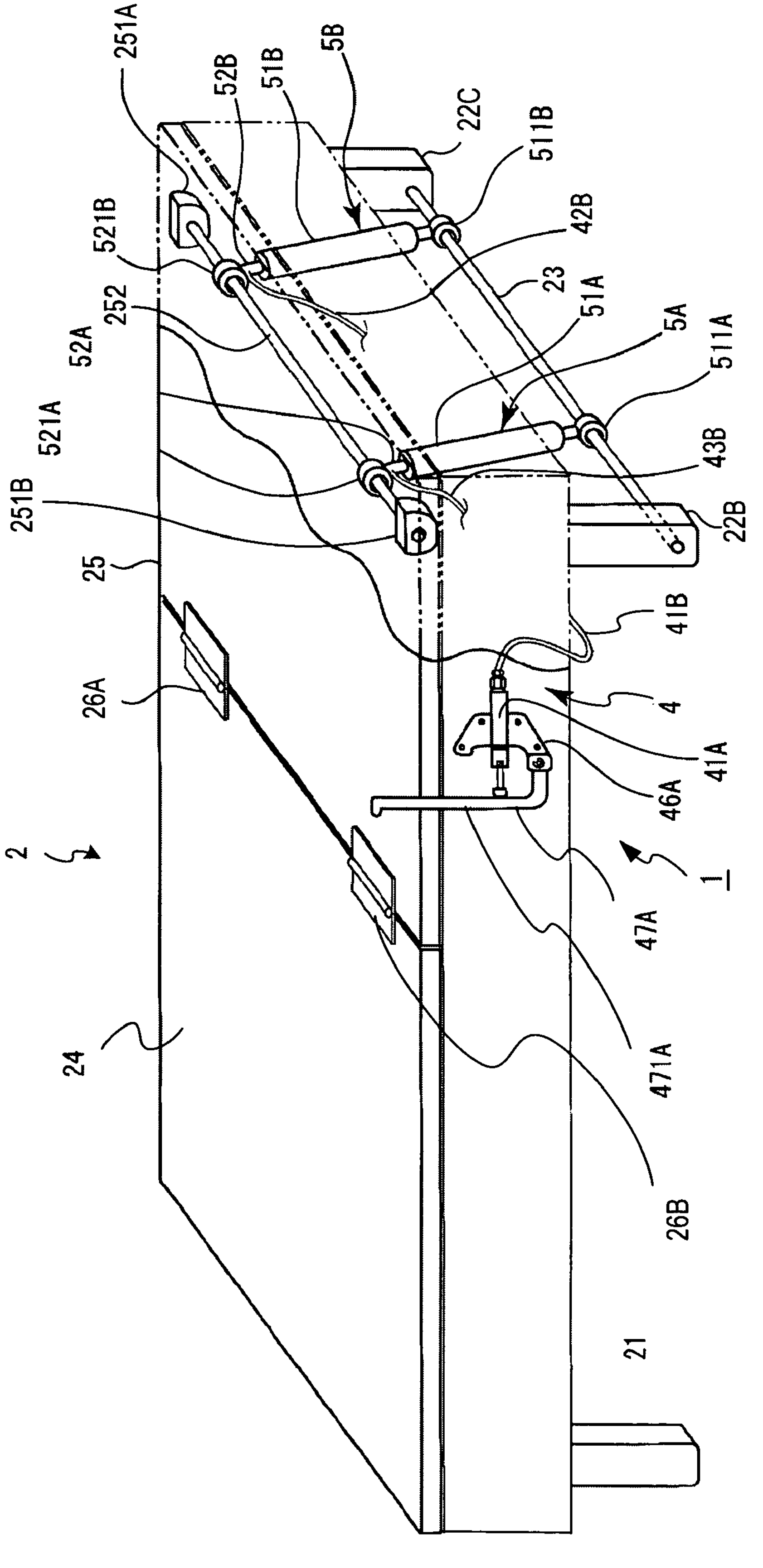
FIG. 1 is an overall perspective view of a nursing care bed as a first embodiment using an operating device according to the present invention.
Figure 2:
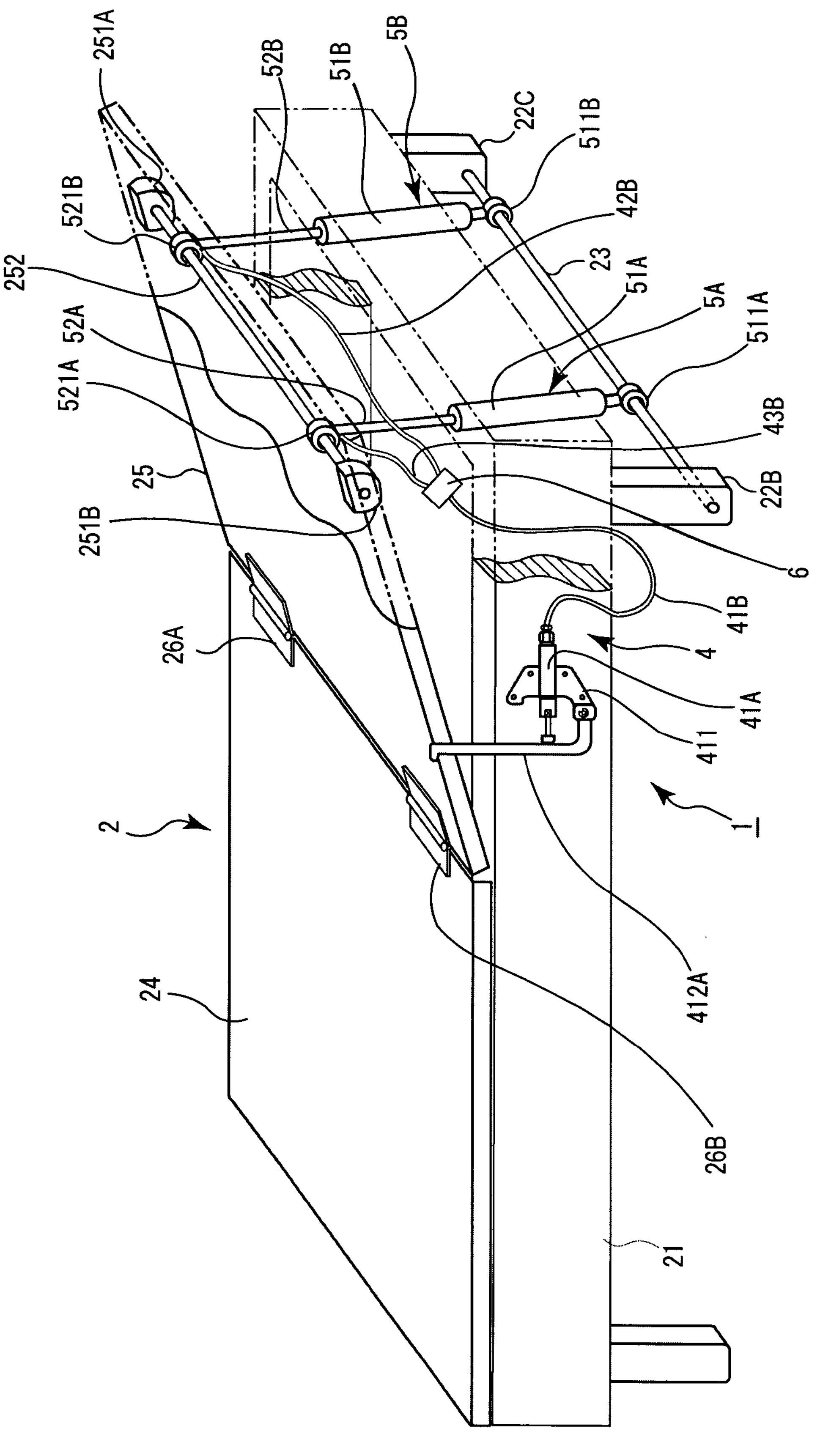
FIG. 2 is an overall perspective view of a nursing care bed using an operating device according to the present invention.

Embodiments of the present invention are hereinafter explained in detail with reference to drawings. FIGS. 1 and 2 illustrate an overall perspective view showing a configuration of the operating device 1 of the present invention used in a nursing care bed 2 as a first embodiment. In the nursing care bed 2, a frame body 21 formed in a rectangular form is horizontally arranged, and four legs protruding downward at the four corners of the frame body 21 and top panels 24 and 25 covering the upper side of the frame body 21 are provided. The top panel 24 is fixed to the upper side of the frame body 21, and the top panels 24 and 25 are arranged in a way that are reciprocally facing at a center of the bed 2. And the top panel 25 is connected to the top panel 24 with hinges 26A and 26B, and the top panel 25 is configured to oscillate upward against the top panel 24.

Onto legs 22B and 22C on the top panel 25 side, a supporting bar 23 is provided, and the rear ends of two extension devices 5A and 5B are connected oscillatably to the supporting bar 23. On the lower side of the top panel 25, a pair of supporting projections 251A and 251B, and a supporting bar 252 is installed between the supporting projections 251 A and 251B. On the supporting bar 252, the front ends of the extension devices 5A and 5B, which are connected to the supporting bar 23 at the rear end, are oscillatably connected. By such configuration, the inclination angle of the top panel 25 is configured to be adjusted by the extension and contraction of the extension devices 5A and 5B.

Onto the extension devices 5A and 5B, an operating device is connected for the operation of positioning these lengths. An operating device 4 is provided with an operation section 41A as a pressurizing operation unit, an action section 41C as an action unit, and branch channels 42B and 43B as conducting channels for guiding oil, which is a pressure conducting medium, between the operating section 41A and the action section 41C.

Figure 3:
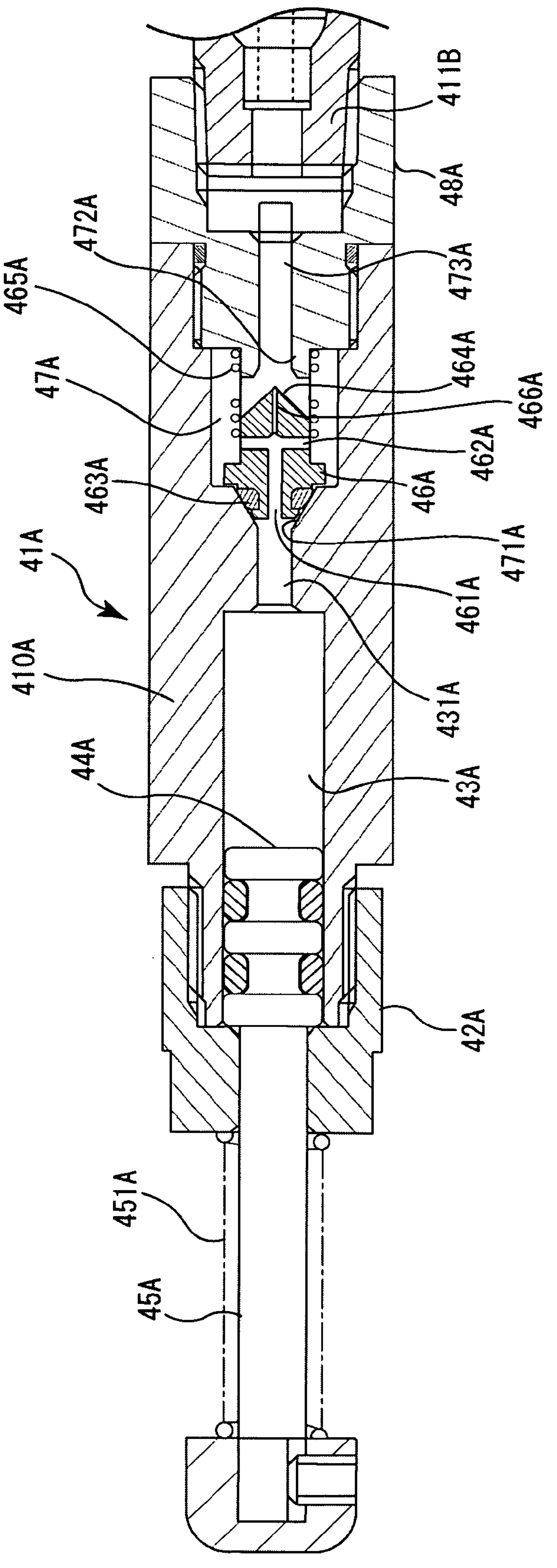
FIG. 3 is a cross-sectional view showing a configuration of an operating section of an operating device.
Figure 4:
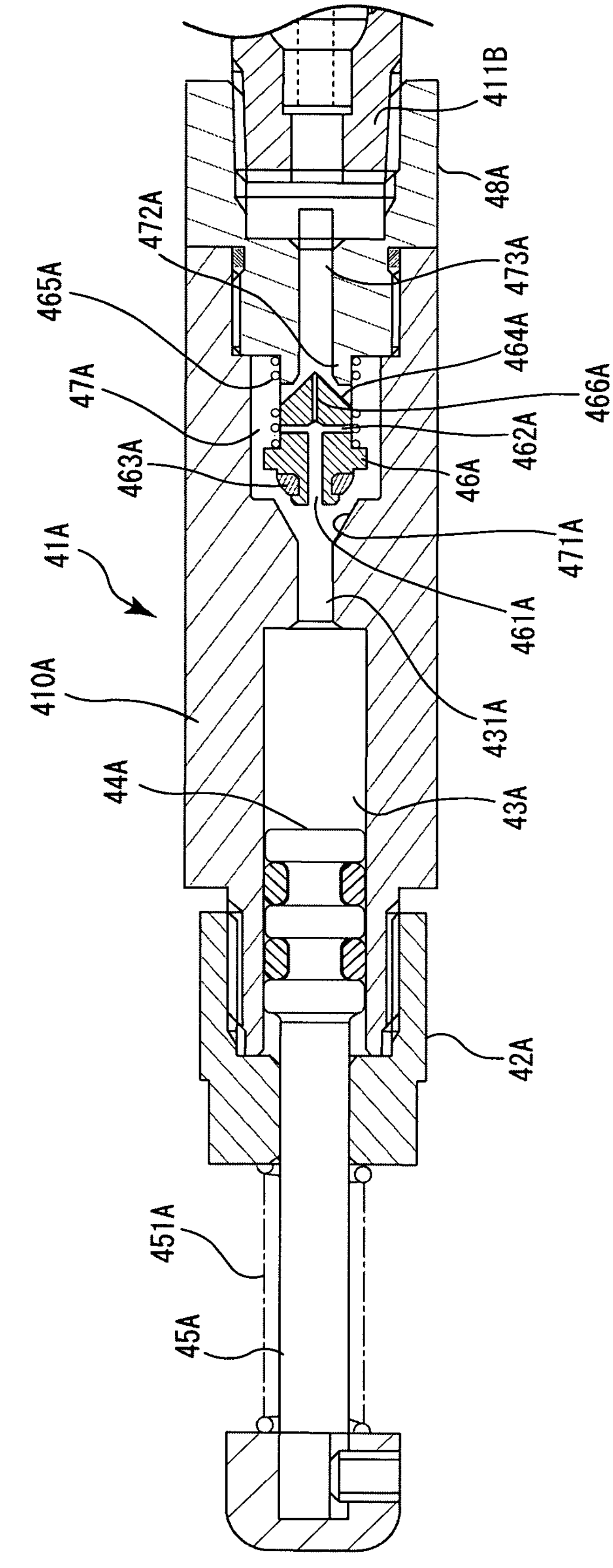
FIG. 4 is a cross-sectional view showing a configuration of an operating section of an operating device.
Figure 5:
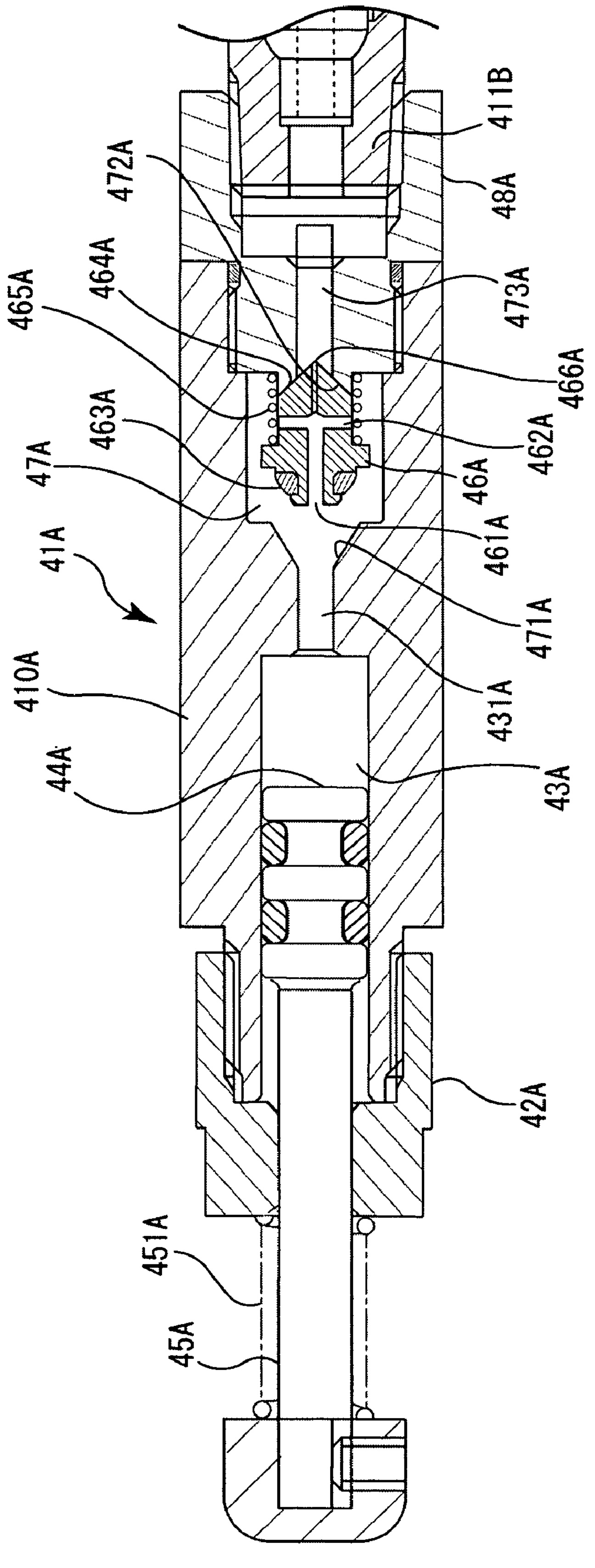
FIG. 5 is a cross-sectional view showing a configuration of an operating section of an operating device.

As shown in FIGS. 1 and 2, the operating section 41A is provided for a user to operate lock release of the extension mechanism. The operating section 41A is fixed to the side face of the frame body 21 of the nursing care bed 2, and is provided adjacent to the top panel 25, thus the release operation can be performed simultaneously when performing an oscillating operation on the top panel 25. FIGS. 3 to 5 are cross-sectional views of the operating section 41A of the operating device 4. On to the operating section 41A, which is a pressurizing operating unit, provided are, an operating section main body 410A, a mounting section 411 to fix the operating section main body 410A to the frame body 21, an operating member 412A, and a piston 44A, which has a piston rod 45A.

The operating section main body 410A and the mounting section 411 are formed as a unit. A cylinder 43A is formed inside the operating section main body 410A and a piston 44A is stored in the cylinder 43A. The cylinder 43A communicates to a valve chamber 47A through a communicating channel 431A, and a lid body 48A is inserted into the rear end portion of the valve chamber 47A. The lid body 48A is communicated with a lead-out channel 473A. And one end of the lead-out channel 473A has an opening 472A inside the valve chamber 47A, and the other end has an opening at a connecting portion of the connecting tube 411B. The front end of the cylinder 43A is blocked by the lid body 42A. The piston rod 45A connected to the piston 44A is inserted through the lid body 42A, and protrudes outside of the operating portion main body 41A, and its front end contacts the operating member 412A.

Onto the opening 471A, where the valve chamber 47A and communicating channel 431A are connected, a taper is formed and the front end of the valve body 46A is caught in this opening 471A. The valve body 46A is stored inside the valve chamber 47A and is provided reciprocatably in the axis direction of the valve chamber 47A. Onto the front end of the valve body 46A, a seal member 463A is installed and this contacts to the taper face of the opening 471A. Also, onto the rear end of the valve body 46A, a taper face 464A is formed. This taper face 464A contacts the opening 472A when the valve body 46A moves to the rear end side.

Also, the valve body 46A has a circulation opening 461A on the front end, and this circulation opening 461A is communicating to the external side face of the valve body 46 though a channel 462A. The cylinder 43A and the valve chamber 47A are maintained in a state that the oil can be circulated under a predetermined amount even when the valve body 46A is blocking the opening 471A by the circulation channel 461A and the channel 462A. Further, a throttle section 466A, which communicates with the channel 462A and the rear end, is formed. The throttle section 466A functions as a throttle to regulate the flow rate when the valve body 46A contacts the opening 472A. The throttle section 466A is a channel with a smaller traverse area compared to the circulation opening 461A.

Between the valve body 46A and the lid body 48A of the rear end side, a compressed spring 465A as a bias member are provided, thereby the valve body 46A is constantly biased towards the opening 471A. A spring 451A is externally mounted to bias in a direction to which the piston rod 45A is pulled out. This is also to restore the piston rod 45 after a release operation.

Figure 6:
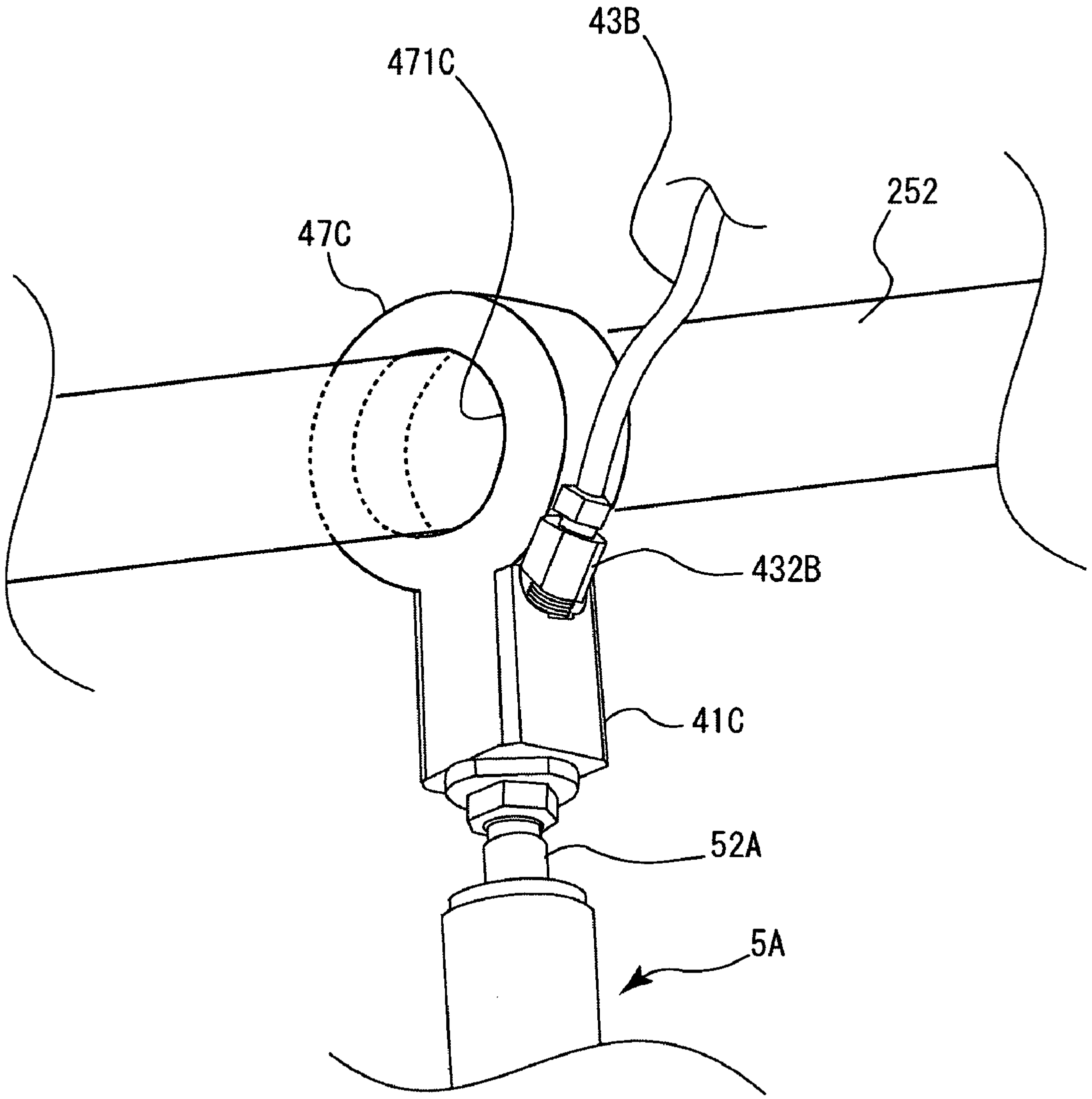
FIG. 6 is an overall perspective view showing a mounting state of an action section of an operating device.
Figure 7:
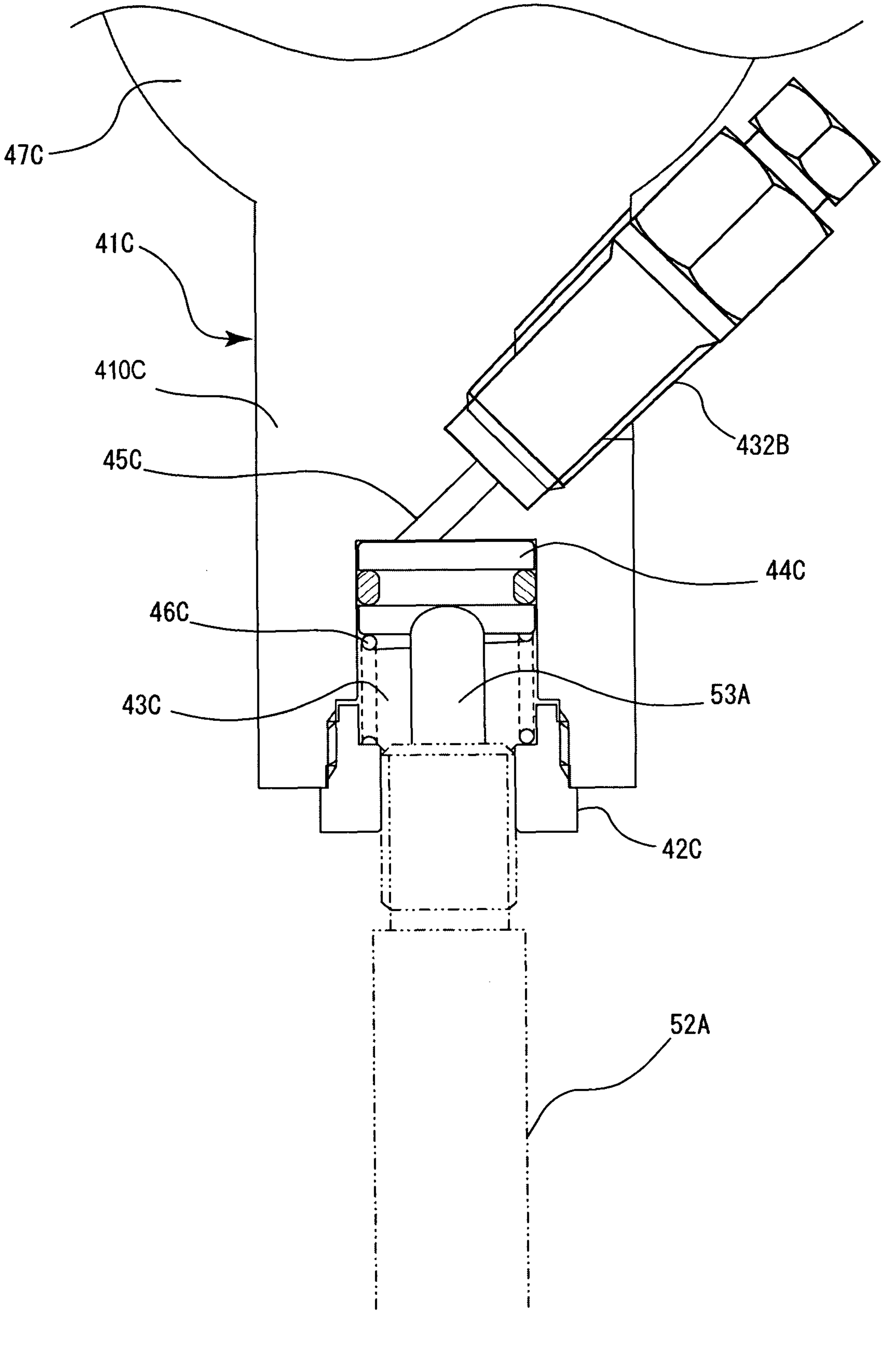
FIG. 7 is a cross-sectional view of an acting section.

Next, the action section 41C is explained. The action section 41C is provided to each of the piston rods 52A and 53B on each of the extension mechanisms 5A and 5B. The action section 41C provided to the piston rod 52A of the extension mechanism 5A is hereinafter explained. FIG. 6 is an overall perspective view of an attaching state of the action section 41C. FIG. 7 is a cross-sectional view of the action section 41C. The action section 41C is provided with an action section main body 410C, a connecting section 42C to connect and fixed the front end of the piston rod 52 of the extension mechanism 5, and a piston 44C.

A cylinder 43C is formed inside the action section main body 410C, and a piston 44C is stored in the cylinder 43C. Also, inside the cylinder 43C, an operating button 53A of the piston rod 52A connected though the connecting section 42C is inserted and contacts a face on one side of the piston 44C. On the face on the opposite side of the piston 44C, an oil chamber filled with oil by the cylinder 43C and the piston 44C is formed (FIG. 7 illustrates a condition where the oil is pressed out). Onto the cylinder 43C, the communicating channel 45C is connected, and the communicating channel 45C is connected to the branch channel 43B though the connecting section 432B.

Onto the action section main body 410C, a looped section 47C is formed as a connecting section, and a supporting bar 252 is inserted into a insertion hole 471C, which is formed in a center of the looped section 47C. The action section main body 410C is rotatably connected against the supporting bar 252 at the looped section 47C. The operating section 41A and the action section 41C are connected through an oil feeding pipe, and the oil, that is a pressure communicating medium, is circulated between the cylinder 43A of the operating section 41A and the cylinder 43C of the action section 41C through the oil feeding pipe.

The oil feeding pipe is provided with a conducting channel 41B, a bifurcating section 6, and two branch channels 42B and 43B. The conducting channel 41B and the branch channels 42B and 43B are loop bodies configured from a flexible material, and for example, it may be configured from a synthetic resin. By configuring the conducting channel 41B and branch channels 42B and 43B from a soft material, the resistance against deformation is decreased, thereby the resistance applied to the up and down of the top panel 25 can be decreased.

Figure 8:
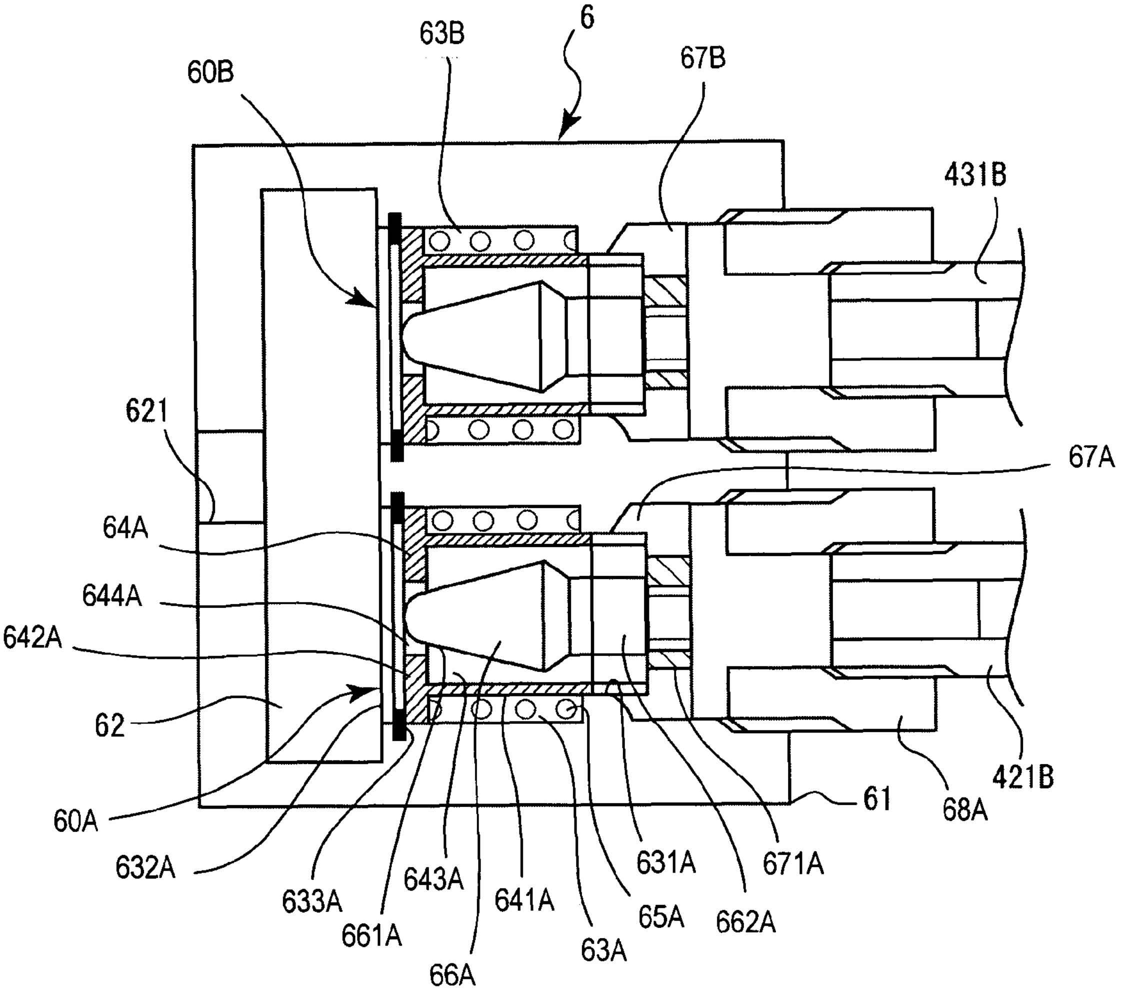
FIG. 8 is a cross-sectional view of a bifurcating section.

The conducting channel 41B and the two branch channels 42B and 43B are connected through the bifurcating section 6. The configuration of the bifurcating section 6 is explained with reference to a cross-section diagram of FIG. 8. The bifurcating section 6 is provided with a housing 61, storing sections 63A and 63 B to store flow rate regulating sections 60A and 60B, a flow dividing chamber 62, and bifurcating channels 67A and 67B. The flow-dividing chamber 62 is provided with a connecting opening 621 to be connected to the conducting channel 41B, and further, each one end of the storing sections 63A and 63B are opened. The flow rate regulating sections 60A and 60B are stored in each of storing sections 63A and 63B. Each of connecting ends 421B and 431B of the branch channels 42B and 43B are connected to each bifurcating channel 67A and 67B. Each of the flow-rate regulating sections 60A and 60B have the same configuration, thus one of the flow-rate regulating sections 60A is explained here, and the explanation for the configuration of the other flow rate regulating section 60B is omitted.

On an opening 632A on the flow-dividing chamber 62 side of the storing section 63A, a loop-form stopper 633A is buried in the inner wall. A tube-form valve 64A contacts the stopper 633A. The valve 64 has a tube section 641A and a plate-form valve section 642A, which is provided to the stopper 633A side of the tube section 641A. The tube section 641A is movably fitted to the inside of a projection section 631A that protrudes into the storing section 63A. The plate-form valve section 642A has a circular-form valve opening 644A at a center. The valve 64A is biased towards the stopper 633A by a compressed spring 65A inserted between the circumferential end of the valve section 642A and the projection section 631A. A valve seat 66A is arranged inside of the valve 64A. The valve 66A has a conical form, and its front end reaches inside the valve opening 644A formed in the center of the valve 64A. The oil circulates between the flow-dividing chamber 62 and an inner space 643A of the valve 64A though a gap formed between the valve opening 644A and the front end portion of the valve seat 66A. On the front end portion of the valve seat 66A, a taper 661A is formed. Thus, when the oil flows into the flow rate regulating sections 60A from the flow dividing chamber 62, the gap gradually decreases as the valve body 64A moves towards the rear end of the valve seat 66A by the hydraulic pressure, and ultimately blocks the valve opening 644A of the valve 64A. The rear end 662A of the valve seat 66A is screwed to fix to a supporting section 671A provided inside the storing section 63A. At a rear end opening of the storing section 63A, a tube-form connecting member 68A is threaded in and the connecting end 421B of the branch channel 42B is connected. The oil flowing into the rear end direction of the valve seat 66A from the valve opening 644 flows into the branch channel 42B though a space formed around the supporting section 671A.

By the balance of the spring 65A and the pressure from the oil flowing into the valve opening 644A of the valve 64A, the spacing formed between the valve opening 644A and the valve seat 66A is adequately adjusted and regulated to constantly flow in a certain flow rate. Because the flow rate regulating section 60B, which has the same configuration as such flow rate regulating section 60A, is proximately provided, the amount of the oil, that is a pressure communicating medium, supplied to each of branch channels 42B and 43B can be virtually equal, and the amount of the positioning operation of the extension mechanisms 5A and 5B (namely, the distance of the piston 44C) can be virtually equal. In this way, the extension operation for the extension mechanisms 5A and 5B can be performed at the same time.

Figure 9:
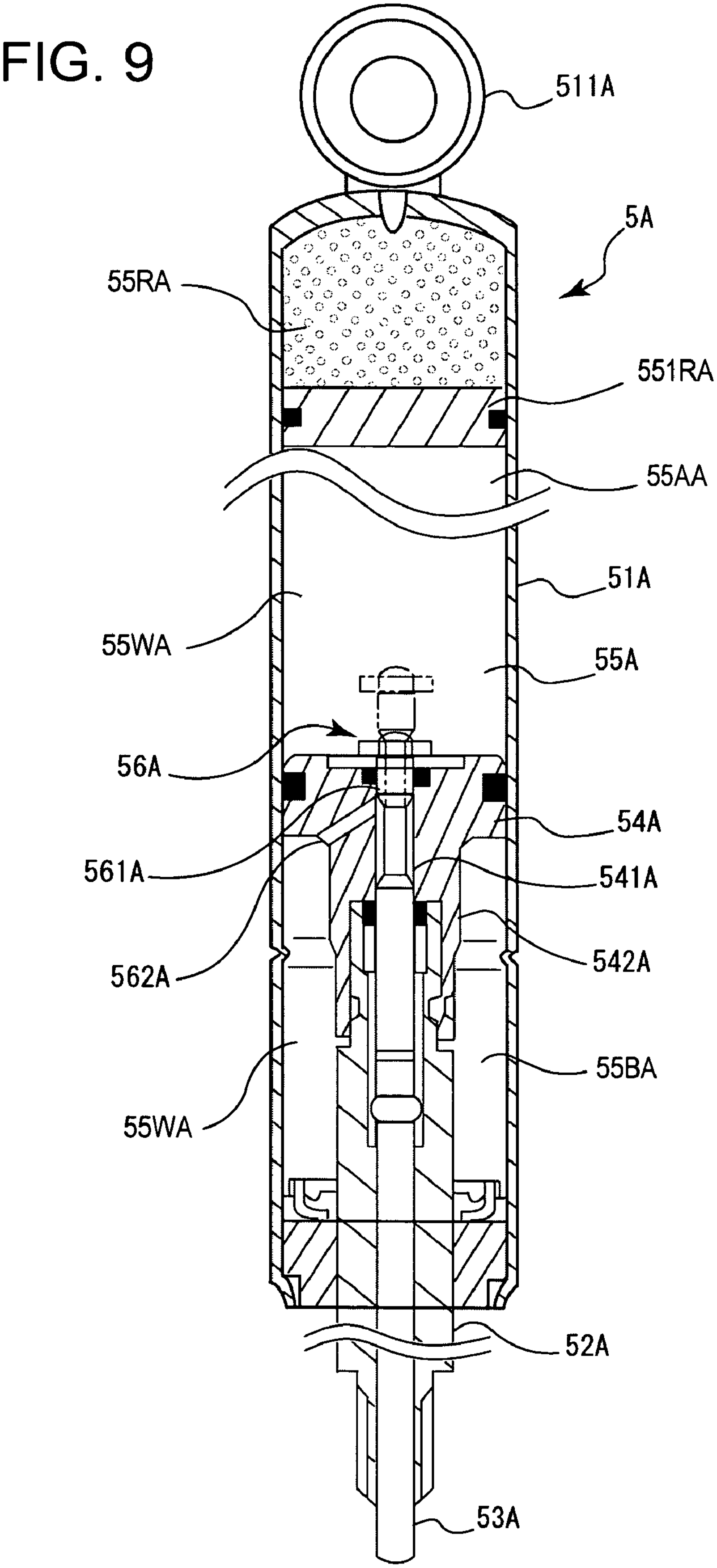
FIG. 9 is an overall cross-sectional view of an extension mechanism.

Next, the configuration of the extension mechanisms 5A and 5B is hereinafter explained. FIG. 9 is a cross sectional side view of the extension mechanism 5A. The extension mechanism 5B has the same configuration as the extension mechanism 5A, therefore the explanation is omitted. The extension mechanism 5A is provided with a cylinder main body 51A, a piston 54A, a piston rod 52A, a gas 55RA, a piston 551RA for a gas spring, and a positioning mechanism 56A.

One end of the cylinder main body 51A is provided with a looped section 511A as a connecting section, and the supporting bar 23 is rotatably inserted into a hole of the looped section 511A. The cylinder main body 51A is formed in a tube form, and a cylinder 55A is formed inside the cylinder main body 51A. Inside of the cylinder 55A, a piston 54A is stored and divides the cylinder 55A into a first chamber 55AA and a second chamber 55BA. A fluid 55WA, such as oil, is filled in each of the first chamber 55AA and the second chamber 55BA.

In the piston 54A, a mounting section 542A of the piston rod 52A on the second chamber 55BA side, and one end of the piston rod 52A is connected to the mounting section 542A. The other end of the piston rod 52A protrudes outside of the cylinder 55A, and an operating button 53A protrudes from the front end of the piston rod. As the piston 54A moves inside the cylinder 554A, the piston rod 52A advances and retracts against the cylinder 55A, thereby the total length of the extension mechanism 5A extends and retracts.

On the center of the piston rod 52A, an operating rod 541A is inserted in the axis direction, one end of the operating rod 541A is connected to a valve 561A, with the other end configuring the operating button 53A described above. The valve 561A is stored in the piston 54A. A circulation channel 562A is formed in the piston 54A. One end of the circulation channel 562A is open to the first chamber 55AA, and the other end is open to the second chamber 55BA. In this way, the fluid 55WA filled in the cylinder 55A can move between the first chamber 55AA and the second chamber 55BA through this circulation channel 562A, thereby the piston 54A is enabled to move while the fluid is in a movable state.

On the opening on the first chamber 55AA side of the circulation channel 562A, a valve 561A is provided. When the operating button 53A is pressed in, the valve 561A protrudes to the first chamber 55A side and opens the circulation channel 562A, thereby the piston 54A is in a movable state, that is, an expandable state. Also, when the valve 561A blocks the opening on the first chamber 55AA side of the circulation channel 562A, the extension mechanism 5A is in a non-expandable state, and in a state that is positioned at a predetermined length. In this way, the positioning mechanism 56A is provided with an operating rod 541A, a valve 561A, and a circulation channel 562A.

In the first chamber 55AA, a gas 55RA and a piston 551RA for gas spring is provided. The piston 551RA segregates the gas 55RA and the oil 55WA and acts as a buffering mechanism when a load is applied in the compressing direction of the extension mechanism 5A and the gas 55RA is compressed and increased in volume.

In the configuration described above, when operating the operating lever 471A and a large operating amount is taken, a rapid increase in the operating amount of the pressure communicating medium can be suppressed by the effect of the valve 46A of the operating section 41A. Further, the operating amount communicated to the positioning mechanism of each of the extension mechanisms 5A and 5B is adjusted to be equal by the bifurcating section 6. Namely, because the rapid increase in the operating amount of the pressure communicating medium is suppressed, a fine adjustment of the distance of the valve 561A of the positioning mechanism 56A can easily performed, thus the top panel 25 can easily be operated such that up and down speed of the top panel 25 is gradual. Further, by the bifurcating section 6, the operating amount communicated to the positioning mechanism of each of the extension mechanisms 5A and 5B is adjusted to be equal, thereby the contraction amount of two of the extension mechanisms 5A and 5B can be equal.

Figure 10:
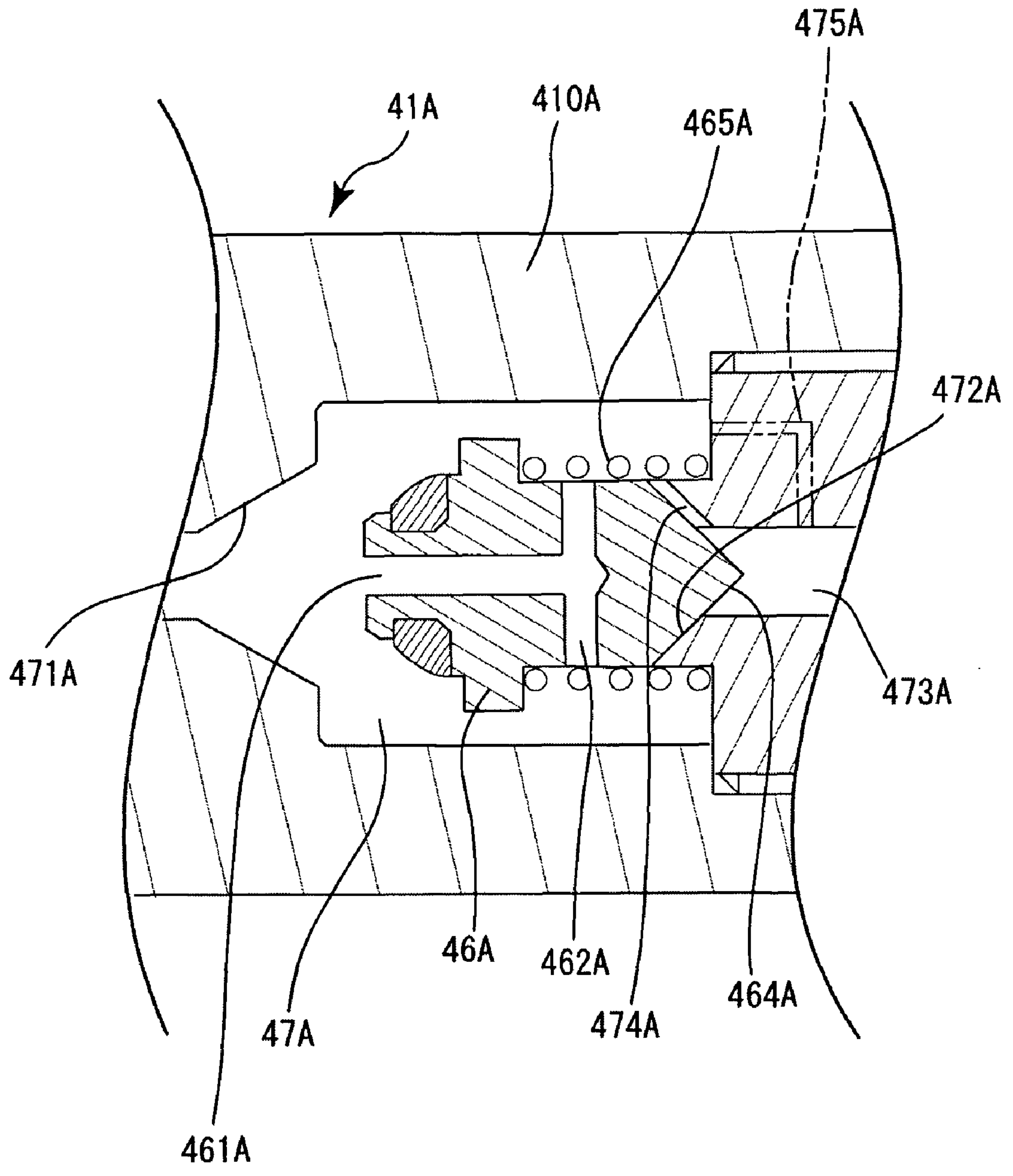
FIG. 10 is a partial enlarged cross-sectional view of an operating device showing another configuration.

Another example of a configuration is hereinafter explained. In FIG. 10, a groove 474A is formed in a diameter direction at the taper face of the opening 472A, instead of the throttle section 466A formed on the valve 46A. Both ends of the groove 474A reach to the outer circumference edge and the inner circumference edge of the opening 472A. The oil circulates in the groove 474A and acts as a throttle section while the valve 46A blocks the opening 472A. As another configuration of the throttle, other than forming a groove on the opening 472A, a circulation channel 475A, which communicates the valve chamber 47A and the lead out channel 473A, may be formed separately and the circulation channel 475A functions as a throttle.

Figure 11:
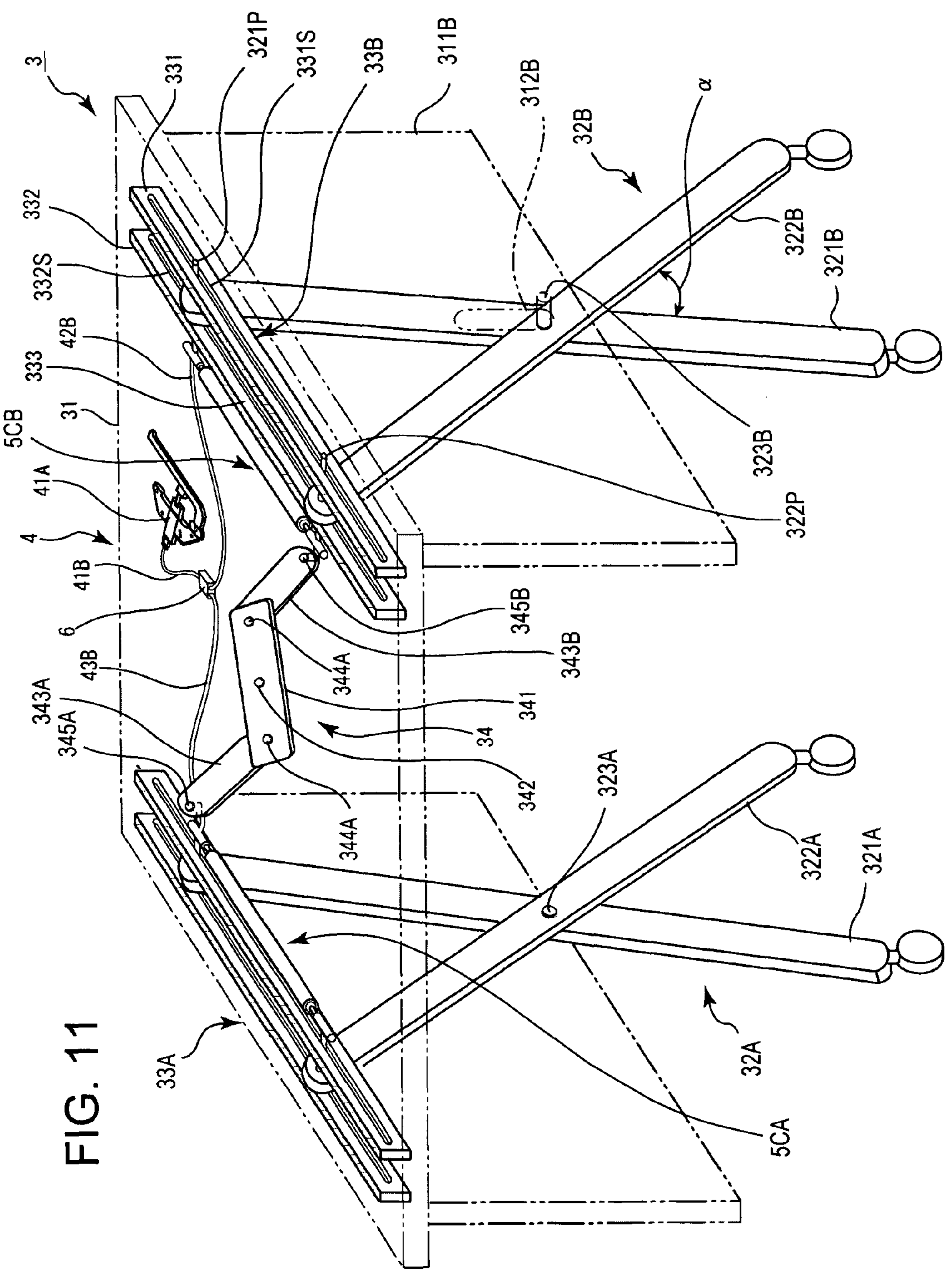
FIG. 11 is an overall perspective view of a desk with an operating device of the present invention mounted as a second embodiment.
Figure 12:
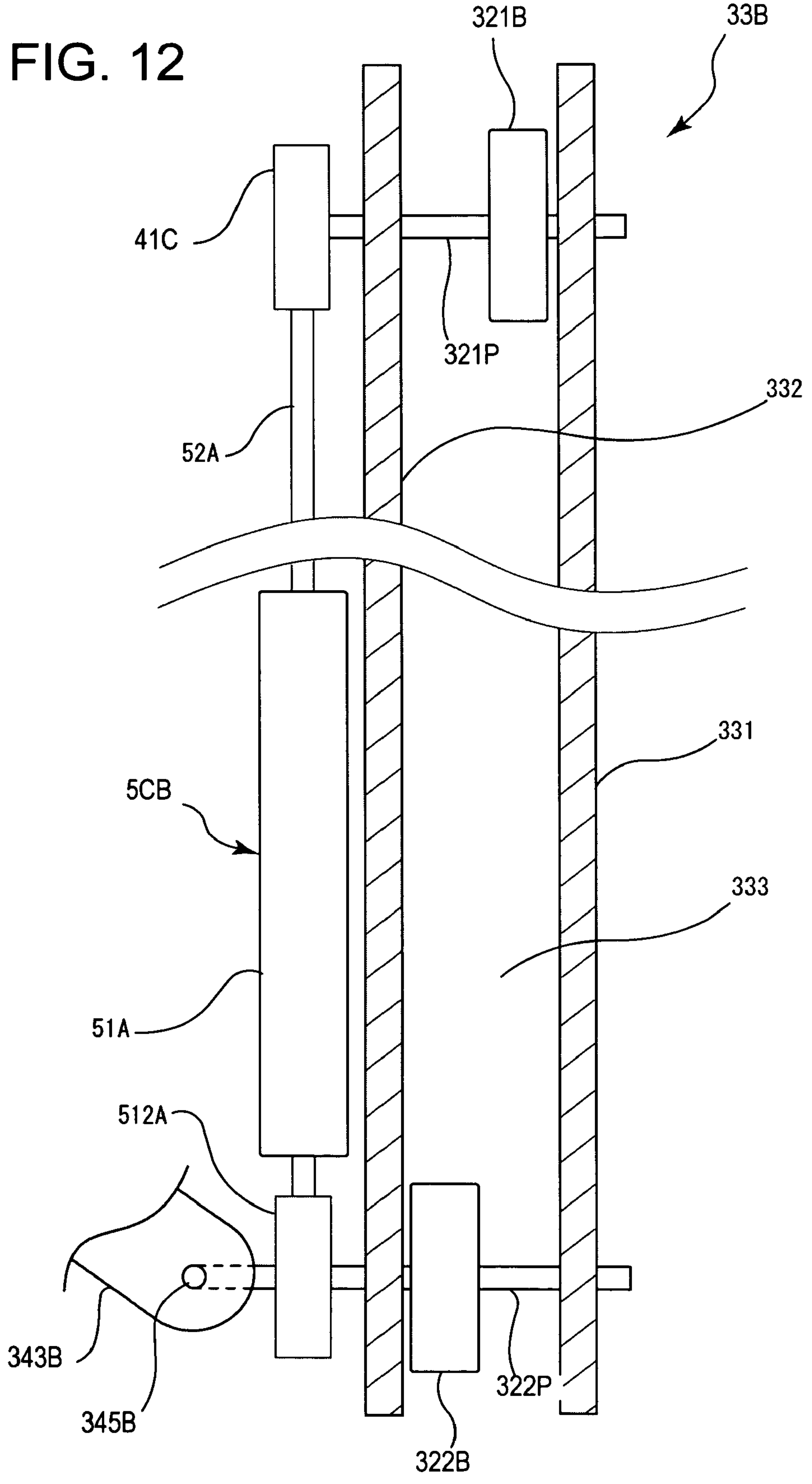
FIG. 12 is a plane view showing a height adjustment mechanism.
Figure 13:
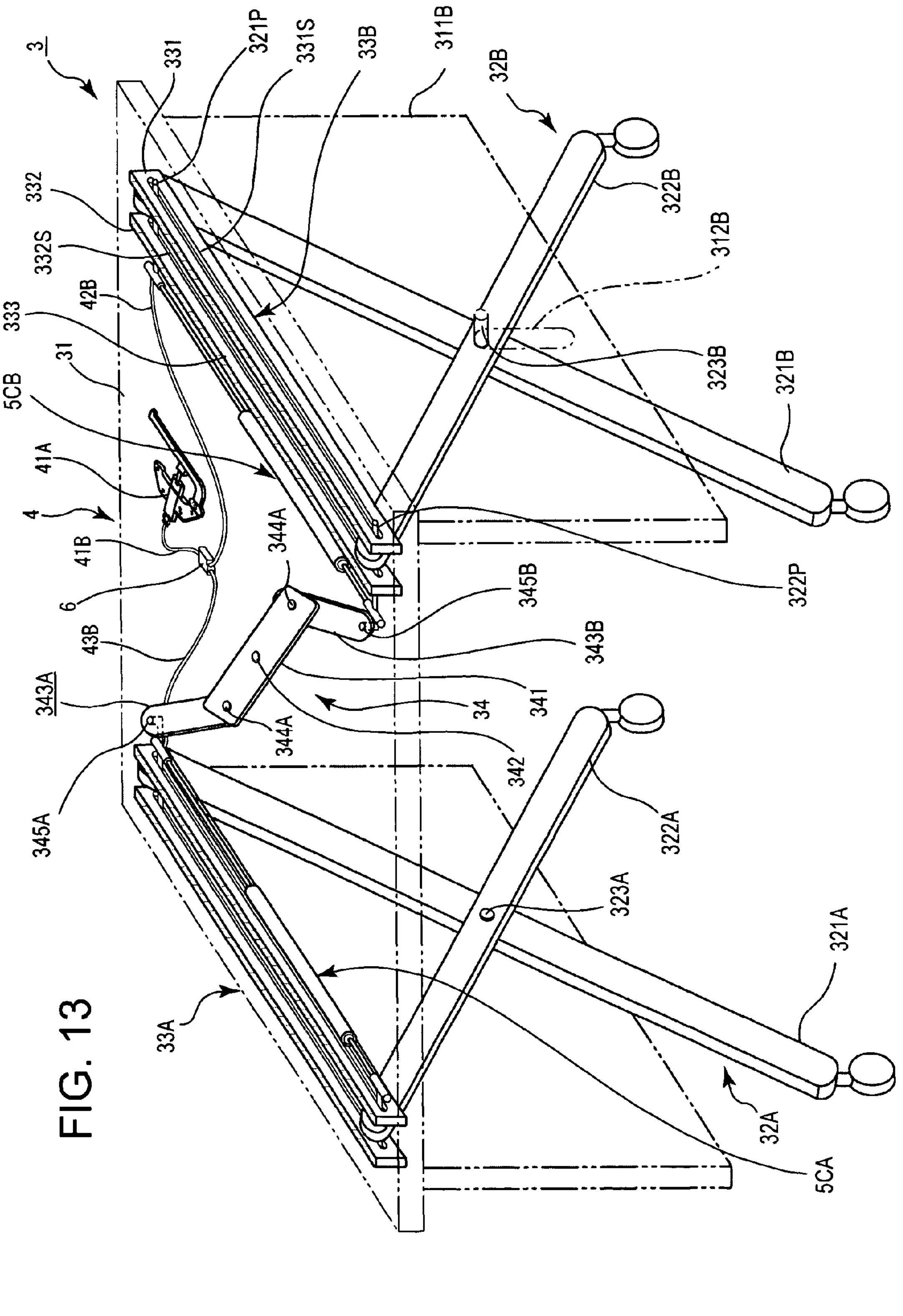
FIG. 13 is an overall perspective view of a desk with the operating device according to the present invention mounted as a second embodiment.

FIGS. 11 and 13 illustrate overall perspective views of a desk 3 with the operating device of the present invention mounted as a second embodiment. The desk 3 is configured to be able to adjust heights. FIG. 11 shows the desk set to the highest position, and FIG. 13 shows the desk 3 set to the lowest position. FIG. 12 is a plane view of a height adjustment mechanism.

The desk 3 has a top panel 31, two elevation supporting devices 32A and 32B, height adjusting mechanisms 33A and 33B, which adjust the height of the top panel 31 through the elevation supporting devices 32A and 32B, and an operating device 4. The top panel 31 is formed in a rectangular form and on the lower face side of the top panel 31, the height adjusting mechanisms 33A and 33B are arranged along the edges facing each other. On each height adjusting mechanism 33A and 33B, the elevation supporting devices 32A and 32B are connected respectively. Each of the height adjusting mechanisms 33A and 33B and the elevation supporting devices 32A and 32B have the same configuration, thus the configuration of the height adjusting mechanism 33B and the elevation supporting device 32B is explained and the explanation of the height adjusting mechanism 33A and the elevation supporting device 32A is omitted.

The height adjusting mechanism 33A is connected to the elevation supporting device 32A and the height adjusting mechanism 33B is connected to the elevation supporting device 32B. The elevation supporting device 32B is provided with two leg members 321B and 322B, and a fulcrum axis 323B rotatably connects the leg members 321B and 322B at the center. The fulcrum axis 323B is inserted into an elongate hole 312B formed on a side panel 311B fixed to the lower face of the top panel 31. The elongate hole 312B is formed in a vertical direction and the fulcrum axis 323B moves up and down in the elongated hole 312B corresponding to the change in the height of the top panel 31.

On the lower end of each of the leg members 321B and 322B, a roller is provided, and slide pins 321P and 322P are inserted into the upper ends. The height adjusting mechanism 33B is arranged parallel on the lower face of the top panel 31, and provided with guiding members 331 and 332, and an extension mechanism 5CB. In a guiding space 333 between the guiding members 331 and 332, upper end portions of the leg members 321B and 322B are stored. Slide pins 321P and 322P inserted into the upper end portion of the each leg members 321B and 322B are further inserted into slits 331S and 332S formed on the guiding members 331 and 332.

Between the slide pins 321P and 322P protruding outside of the guiding space 333, an extension mechanism 5CB is installed. The configuration of the extension mechanism 5CB is the same as the extension mechanisms 5A and 5B, thus the explanation is omitted. Further, in the configuration of the extension mechanisms 5A and 5B, the gas 55RA and the piston 551RA for gas spring in the first chamber 55AA may be omitted. Alternatively, a gas 55RA and a piston 551RA for gas spring on the second chamber 55BA side may be provided to the configuration.

The height adjusting mechanisms 33A positioned on the facing side are also provided with an extension mechanism 5CA, and the elevation supporting device 32A is also provided with leg members 321A and 322A, and a furculum axis 323A. In a case when the extension mechanism 5CB changes to the direction of compressing, the crossing angle α of the leg members 321B and 322B decreases, thereby the height of the top panel 31 elevates as shown in FIG. 11. Further, in a case when the extension mechanism 5CB changes to the direction of extension, the crossing angle α of the leg members 321B and 322B increases, thereby the height of the top panel 31 descends as shown in FIG. 13.

The extension mechanisms 5CA and 5CB are operated by the operating device 4. The configuration and effects are the same as the configuration described above based on FIGS. 1 to 8, and the same reference numbers are used, thus the explanation is omitted. Onto the slide pins located diagonally on the top panel 31, connecting pins 345A and 345B are provided, and the connecting pins 345A and 345B are connected with a link mechanism 34. The link mechanism 34 has an oscillating member 341 rotatably supported by a rotation axis 342 on the center of the lower face of the top panel 31, and connecting members 343A and 343B are oscillatably connected on the both ends of the oscillating member 341. One end of each of the connecting members 343A and 343B are connected to the oscillating member 341 through the furculums 344A and 344A, and the other ends are oscillatably connected to each of connecting pin 345A and 345B. Such a link mechanism 34 equalizes the distance of the leg members at the height adjusting mechanisms 33A and 33B on the both ends.

Figure 14:
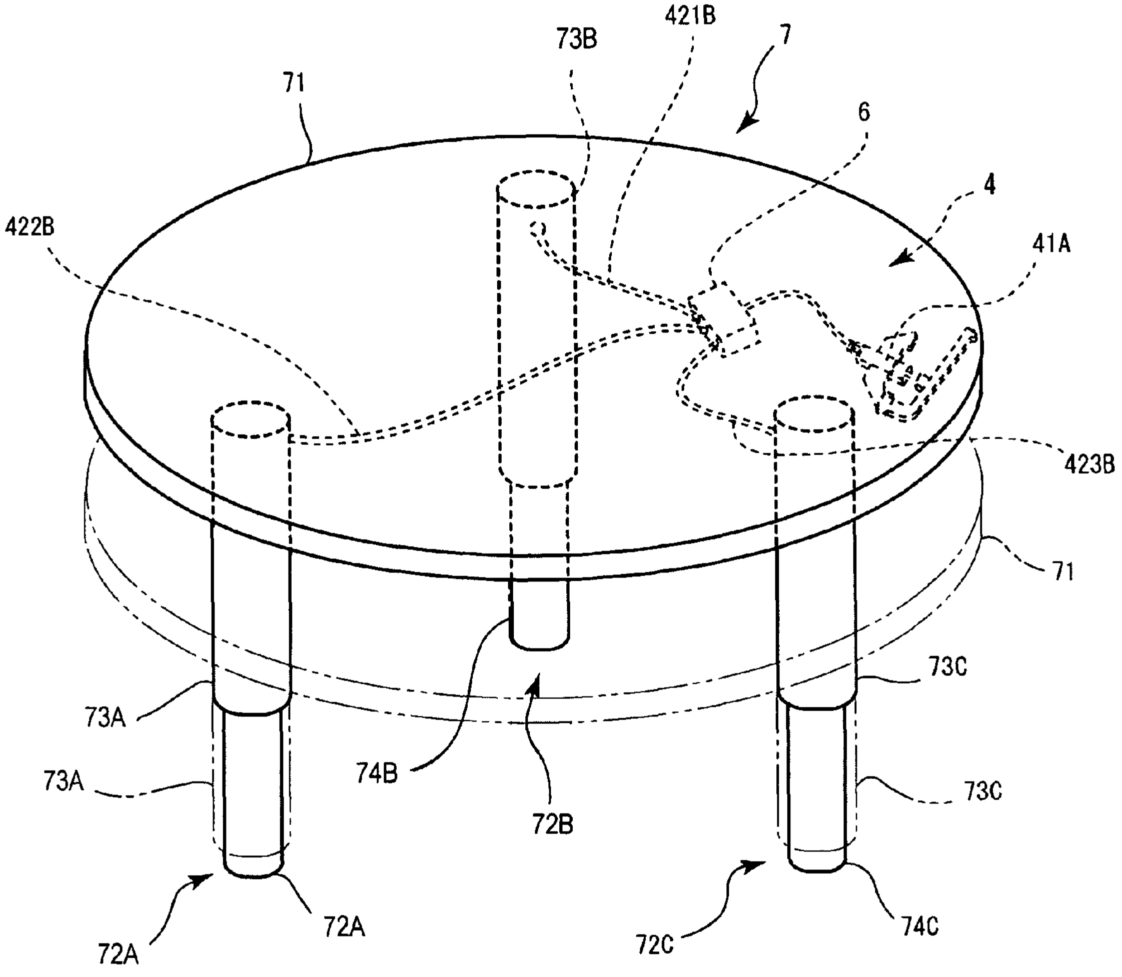
FIG. 14 is an overall perspective view of a table with an operating device of the present invention mounted as a third embodiment.
Figure 15:
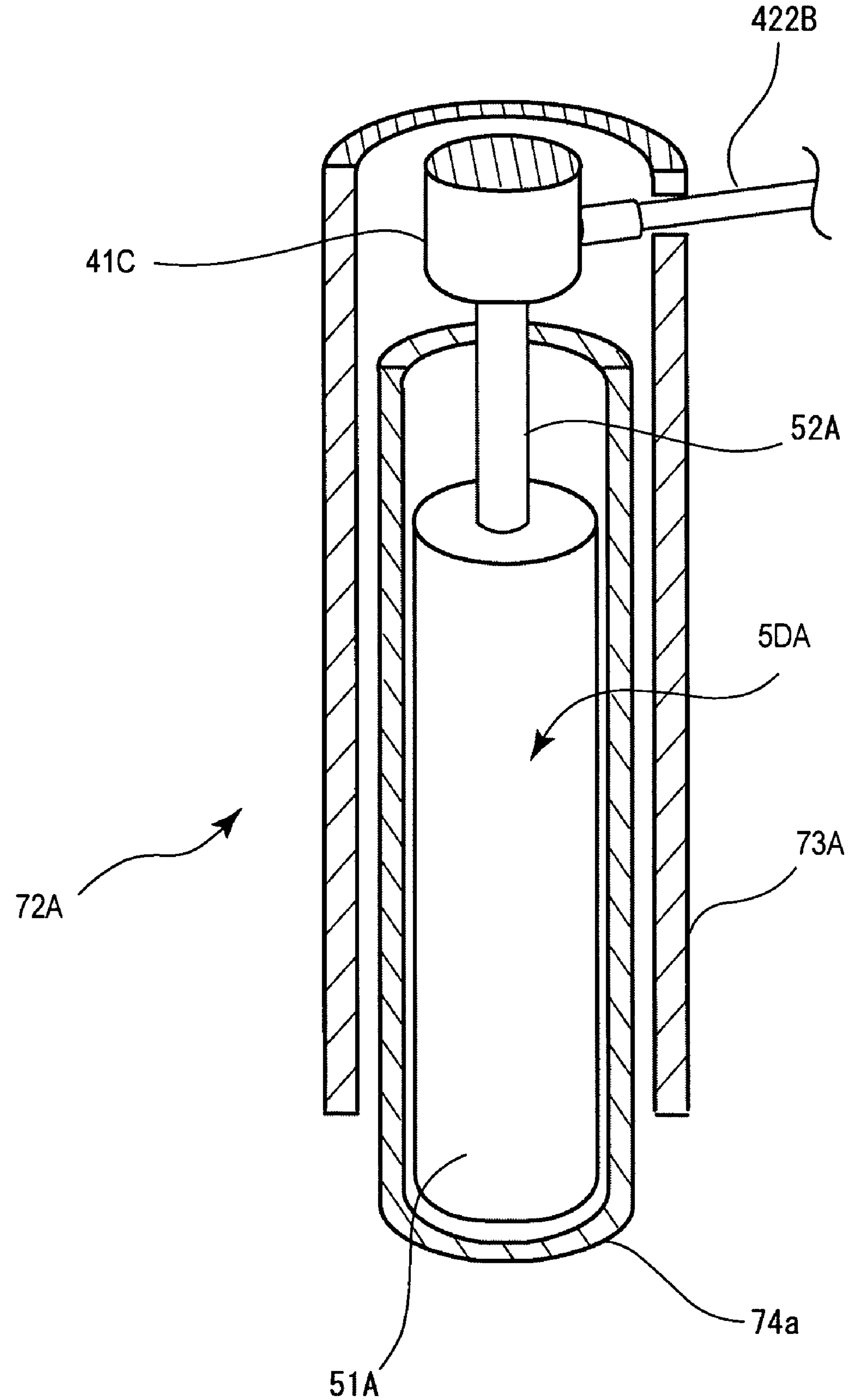
FIG. 15 is a cross-sectional perspective view of a configuration of leg section in the third embodiment.

FIG. 14 is an overall perspective view of a table 7, which is another example of use of the operating device 4. The table 7 has a circular shaped top panel 71, and three leg sections 72A, 72B and 72C. Each of the leg section 72A, 72B and 72C has the same configuration, thus the configuration of the leg section 72A is explained and the explanations for the other leg sections are omitted. FIG. 15 is a cross-sectional perspective view of the leg section 72A. The leg section 72A has a cylindrical form inner storing section 74A and an armor body 73A. The armor body 73A is fixed to the lower face of the top panel 71, and the lower end has an opening. In this opening, the inner storing section 74A is inserted. Inside the inner storing section 74A, the extension mechanism 5DA is stored, the cylinder main body 51A is located on the lower side, and the piston rod 52A protrudes upward. The action section 41C connected to the front end of the piston rod 52A is fixed to the top panel 71 side. Onto the action section 41C, the branch channel 422B is connected and extends outward from the armor body 73A.

Similarly, the other leg sections 72B and 72C have the inner storing sections 74B and 74C, and the armor bodies 73B and 74C, and each of the armor body stores the extension mechanisms. In these three extension mechanisms, the operating device 4 locks and releases the extending position, and the extension of the extension mechanisms adjusts the height of the top panel 71. That is, the height of the top panel 71 increases as the extension mechanism extends, and the height of the top panel 71 decreases as the extension mechanism contracts.

The bifurcating section 6 of the operating device 4 operates the extension mechanism and has three flow rate regulating sections, and three bifurcating channels communicating to each of the flow rate regulating sections. Each bifurcating channel is connected to one end of the branch channels 421B, 422B and 423B, and the other ends are connected to the action section 41C of the extension mechanism integrated into each leg section 72A, 72B, and 72C. By configuring in this way, the flow rate of the pressure communicating medium supplied from the operating section 41A is distributed equally to each of the leg sections 72A, 72B and 72C. And the leg sections 72A, 72B, and 72C start or stop extending and contracting at the same time.

The present invention is explained with reference to examples, however, the present invention is not limited to these. For example, the operating device of the present invention may be applied to anything that adjusts the operating amount by communicating the pressure, and not limited to the nursing care bed, desk, or table. For example, the operating device of the present invention may be applied to a foot pedal for an automobile (such as a foot brake or a gas pedal). Also, various members are explained above, however, all of the members explained above may not be necessary to function each unit. For example, in the flow rate regulating unit, the compressed spring is used as a bias member, however, the bias member other than the compressed spring may be used and the function to regulate the flow rate of the pressure communicating medium can be fulfilled.

The conducing channel and the branch channel may be configured with a thermoplastic resin. As an effect, the thermoplastic resin softens and is capable of expanding outward in a case when the pressure communicating medium expands due to an increase in an ambient temperature, thereby the increase in volume from the rise in the temperature of the pressure communicating medium can be absorbed in the expansion. Specially, in a system in which the pressure communicated though the pressure communicating medium is operated by converting the pressure by the pressure operating unit into the switching operation of the position fix state and the released state of the positioning unit, the thermal expansion of the pressure communicating medium can suppress the pressure from reaching the release state from the position fix state.

What is claimed is:

1. An operating device comprising:

a pressurizing operation unit for applying a pressure to a pressure communicating medium in a fluid form;

a plurality of action units for operating the pressure applied by the pressurizing operation unit by converting the pressure into a switching operation comprising a position fixed state and a released state of a positioning unit;

a conducting channel for releasing the pressure communicating medium from the pressurizing operation unit;

a bifurcating section for distributing the pressure communicating medium from the conducting channel to the plurality of action units;

a branch channel for guiding the pressure communicating medium to each action unit from the bifurcating section;

wherein each branch channel has a flow rate regulating unit for regulating a flow rate of the pressure communicating medium; and each of the flow rate regulating units equalizes the flow rate of the pressure communicating medium located in each of the branch channels;

where the positioning unit comprises a cylinder and a piston located in the cylinder;

where the positioning unit positions an extension device and includes a valve for opening and closing the flow of the fluid located in a cylinder chamber formed on both sides of the piston.

2. The operating device according to claim 1, where the flow rate regulating unit further comprises a valve chamber having an inlet and an outlet opening for the pressure communicating medium;

where the valve chamber comprises a throttle section for regulating an outflow amount of the pressure communicating medium from the outlet, and a valve for operating the throttle section.

3. The operating device according to claim 2, where the throttle section and the valve include a channel capable of receiving the pressure communicating medium; and a traverse area of the channel of the throttle is smaller than a traverse area of the channel of the valve.

4. The operating device according to claim 2, where the operating device comprises a bias member positioned to contact the valve.

5. The operating device according to claim 4, where the bias member is a compressed spring.

6. The operating device according to claim 1, where the flow rate regulating unit further comprises a bias member for operating a position of a valve, and a valve and a valve seat for adjusting a traverse area of the branch channel;

where the flow rate of the pressure communicating medium is regulated by adjusting a width of an area formed between the valve and the valve seat.

7. The operating device of claim 1, where the operating device is employed in a nursing care bed.

8. An operating device comprising:

a pressurizing operation unit for pressurizing a pressure communicating medium in a fluid form by the displacement of an operating member from an external operation;

an action unit for operating the pressure applied by the pressurizing operation unit by converting the pressure into a switching operation comprising a position fixed state and a release state of a positioning unit;

a flow rate regulating unit for regulating a flow rate of the pressure communicating medium exiting the pressurizing operation unit; and a conducting channel for guiding the pressure communicating medium from the pressurizing operation unit;

where the flow rate regulating unit further comprises;

a valve chamber having an inlet for inflowing the pressure communicating medium and an outlet for outflowing the same;

a valve that is pressed to the inlet by a bias member for closing the outlet when the flow rate of the pressure communicating medium exceeds a predetermined amount; and a throttle section for regulating the flow rate passing though the outlet when the valve closes the outlet.

9. The operating device according to claim 8, where the conducting channel further comprises a plurality of channels extending from the pressure communicating medium, with each of the channels comprising the flow rate regulating unit.

10. The operating device according to claim 9, where the flow rate of the pressure communicating medium flowing to the action unit from each of the channels is equal.

11. The operating device according to claim 8, where each of the throttle section and the valve further comprise a channel capable of outflowing the pressure communicating medium;

where a traverse area of the channel of the throttle is smaller than a traverse area of the channel of the valve.

12. The operating device according to claim 8, where the bias member is a compressed spring.

13. The operating device according to claim 8, where the flow rate regulating unit further comprises a bias member for operating a position of the valve, and a valve and a valve seat for adjusting a traverse area of the conducting channel;

where the flow rate of the pressure communicating medium is regulated by adjusting a width of a space formed between the valve and the valve seat.

14. An operating device comprising:

a pressurizing unit for pressurizing a pressure communicating medium;

an action unit for feeding a pressure applied by the pressurizing unit to a plurality of positioning units;

a plurality of branch channels for distributing the pressurized pressure communicating medium to the plurality of positioning units; and a flow rate regulating unit provided to each of the plurality of branch channels for regulating a flow rate of the pressure communicating medium;

where the flow rate of the pressure communicating medium in each of the branch channels is equalized by the flow rate regulating unit; and where each branch channel is comprised of a flexible material.

15. The operating device according to claim 14, where the flow rate regulating unit further comprises a valve chamber having an inlet for inflowing the pressure communicating medium and an outlet for outflowing the same; and the valve chamber further comprises a valve, a valve seat, and a bias member for operating a position of the valve;

where the flow rate of the pressure communicating medium is regulated by adjusting a width of a space formed between the valve and the valve seat.

16. The operating device according to claim 15, where the bias member is a compressed spring.

17. The operating device according to claim 15, where regulating the width of the space formed between the valve and the valve seat occurs when the flow rate of the pressure communicating medium exceeds a predetermined amount.

18. The operating device according to claim 14, where the flexible material is a synthetic resin.

* * * * *